(12) United States Patent
Yakunin et al.

(10) Patent No.: US 9,529,283 B2
(45) Date of Patent: Dec. 27, 2016

(54) RADIATION SOURCE, LITHOGRAPHIC APPARATUS, AND DEVICE MANUFACTURING METHOD

(75) Inventors: Andrei Mikhailovich Yakunin, Eindhoven (NL); Vadim Yevgenyevich Banine, Deurne (NL); Johannes Hubertus Josephina Moors, Helmond (NL); Leonid Aizikovitch Sjmaenok, Vaals (NL)

(73) Assignee: ASML NETHERLANDS B.V., Veldhoven (NL)

( * ) Notice: Subject to any disclaimer, the term of this patent is extended or adjusted under 35 U.S.C. 154(b) by 804 days.

(21) Appl. No.: 13/058,783

(22) PCT Filed: Jul. 29, 2009

(86) PCT No.: PCT/EP2009/005488
§ 371 (c)(1),
(2), (4) Date: Feb. 11, 2011

(87) PCT Pub. No.: WO2010/017890
PCT Pub. Date: Feb. 18, 2010

(65) Prior Publication Data
US 2011/0143269 A1    Jun. 16, 2011

Related U.S. Application Data

(60) Provisional application No. 61/136,152, filed on Aug. 14, 2008, provisional application No. 61/193,420, filed on Nov. 26, 2008.

(51) Int. Cl.
*G21K 5/04*    (2006.01)
*G03F 7/20*    (2006.01)
(Continued)

(52) U.S. Cl.
CPC .......... *G03F 7/70958* (2013.01); *B82Y 10/00* (2013.01); *G02B 5/208* (2013.01); *G03F 7/70033* (2013.01);
(Continued)

(58) Field of Classification Search
USPC ...... 250/504 R; 359/350, 355, 359, 360, 361
See application file for complete search history.

(56) References Cited

U.S. PATENT DOCUMENTS 6,906,787 B2    6/2005  Van De Kerhof et al.
7,154,666 B2    12/2006 Wedowski
(Continued)

FOREIGN PATENT DOCUMENTS

EP    1515188 A1    3/2005
JP    5-217857      8/1993
(Continued)

OTHER PUBLICATIONS

Bibishkin et al., Multilayer Zr/Si Filters for EUV Lithography and for Radiation Source Metrology, Proceedings of the SPIE—The International Society for Optical Engineering—Micro- and Nanoelectronics, SPIE US, vol. 7025, Oct. 1, 2007.
(Continued)

*Primary Examiner* — Nicole Ippolito
(74) *Attorney, Agent, or Firm* — Pillsbury Winthrop Shaw Pittman LLP

(57) ABSTRACT

A spectral purity filter is configured to transmit extreme ultraviolet (EUV) radiation and deflect or absorb non-EUV secondary radiation. In an embodiment, the spectral purity filter includes a body of material highly transmissive of EUV radiation and a layer of material highly reflective of non-EUV secondary radiation located on a radiation incident side of the body. In an embodiment, the spectral purity filter includes a body of material highly transmissive of EUV
(Continued)

radiation and a layer of high emissivity material on an end of the body.

19 Claims, 6 Drawing Sheets

(51) Int. Cl.
  *B82Y 10/00* (2011.01)
  *G02B 5/20* (2006.01)
  *G21K 1/06* (2006.01)
  *G21K 1/10* (2006.01)
(52) U.S. Cl.
  CPC ....... *G03F 7/70191* (2013.01); *G03F 7/70575* (2013.01); *G03F 7/70941* (2013.01); *G21K 1/062* (2013.01); *G21K 1/10* (2013.01)

(56) References Cited

U.S. PATENT DOCUMENTS

| 7,372,623 | B2 | 5/2008 | Banine et al. | |
|---|---|---|---|---|
| 8,139,200 | B2 | 3/2012 | Van Herpen et al. | |
| 2004/0114120 | A1* | 6/2004 | Van De Kerhof | G01J 1/429 355/67 |
| 2006/0221440 | A1* | 10/2006 | Banine et al. | 359/359 |
| 2006/0245058 | A1* | 11/2006 | Van Herpen et al. | 359/587 |
| 2007/0170379 | A1 | 7/2007 | Watson et al. | |

FOREIGN PATENT DOCUMENTS

| JP | 8-236425 | 9/1996 |
|---|---|---|
| JP | 2000-352612 | 12/2000 |
| JP | 2004-186691 | 7/2004 |
| JP | 2004-524524 | 8/2004 |
| JP | 2006-279036 | 10/2006 |
| JP | 2006-310793 | 11/2006 |

OTHER PUBLICATIONS

Louis et al., Multilayer Optics with Spectral Purity Layers for the EUV Wavelength Range, Proceedings of the SPIE—The International Society for Optical Engineering, SPIE US, vol. 6151, Jan. 1, 2006.

Ravindra et al., Modeling and Simulation of Emissivity of Silicon-Related Materials and Structures, 3rd Symposium on Materials and Processes for Submicron Technologies, Mar. 3, 2003, Journal of Electronic Materials, vol. 32, No. 10, pp. 1052-1058.

Kaye & Laby, The Tables of Physical and Chemical Constants, 16th Edition, 1995, National Physical Laboratory.

Truong et al., Optical Properties of Bulk Niobium form 6.6 to 23 eV, Journal of the Optical Society of America, vol. 68, No. 8, Aug. 1978, pp. 1017-1018.

International Search Report for PCT International Patent Application No. PCT/EP2009/005488, mailed Dec. 23, 2009.

European Office Action dated Jan. 8, 2013 in corresponding European Patent Application No. 09 777 515.9.

Terry A. Johnson et al., "Zirconium and niobium transmission data at wavelengths from 11-16 nm and 200-1200 nm," Proc. of SPIE, vol. 5538, pp. 119-124 (2004).

Forbes R. Powell et al. "Filter windows for EUV lithography," Proc. of SPIE, vol. 4343, pp. 585-589 (2001).

Singapore Written Opinion and Search Report mailed Apr. 19, 2013 in corresponding Singapore Patent Application No. 201100299-5.

* cited by examiner

RADIATION SOURCE, LITHOGRAPHIC APPARATUS, AND DEVICE MANUFACTURING METHOD

CROSS-REFERENCE TO RELATED APPLICATIONS

This application is the U.S. National Phase application of PCT/EP2009/005488, filed Jul. 29, 2009, which claims the benefit of U.S. provisional application 61/136,152 which was filed on Aug. 14, 2008, and of U.S. provisional application 61/193,420 which was filed on Nov. 26, 2008. Both U.S. provisional application 61/136,152 and U.S. provisional application 61/193,420 are incorporated herein in their entirety by reference.

FIELD

The present invention relates to a radiation source for an extreme ultraviolet (EUV) radiation lithographic apparatus, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to be able to project ever smaller structures onto substrates, it has been proposed to use EUV radiation which is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm.

Radiation may be produced using plasma. The plasma may be created, for example, by directing a laser at particles of a suitable material (e.g. tin), or by directing a laser at a stream of a suitable gas or vapor, such as Xe gas or Li vapor. The resulting plasma emits output radiation, e.g., EUV radiation, which is collected using a collector such as a mirrored normal incidence collector, which receives the radiation and focuses the radiation into a beam. Such a radiation source is typically termed a laser produced plasma (LPP) source.

SUMMARY

In addition to radiation, the plasma of a plasma radiation source produces contamination in the form of particles, such as thermalized atoms, ions, nanoclusters, and/or microparticles. The contamination is output, together with the desired radiation, from the radiation source towards the collector and may cause damage to the grazing incidence collector and/or other parts.

A radiation source may also output secondary radiation in addition to the desired radiation. For example, a EUV plasma radiation source may output secondary radiation having a wavelength selected from the range of 20-400 nm in addition to desired EUV radiation, most notably in the deep ultraviolet (DUV) range (100-400 nm). Moreover, the secondary radiation may include EUV radiation that has a certain desired wavelength or range of wavelengths of EUV radiation, as well as other EUV radiation that does not have the desired wavelength or is not within the range of desired wavelengths of EUV radiation. Such secondary radiation may arise in a LPP radiation source due to the laser used to generate the plasma, the laser radiation having a wavelength longer than EUV radiation (often 10.6 μm wavelength radiation from a $CO_2$ laser).

In lithography, it is desirable to improve spectral purity, i.e., to remove secondary radiation from the output beam to yield a higher proportion of desired radiation. For example, resist is sensitive to a wavelength of the secondary radiation, and thus the image quality may be deteriorated. Since the optics of a EUV lithographic apparatus has a high reflectivity (for example, for 10.6 μm wavelength secondary radiation from a LPP source), the secondary radiation may reach the substrate with significant power. Additionally or alternatively, the secondary radiation, particularly the laser radiation in a LPP radiation source, may lead to undesired heating of the patterning device, substrate, and/or optics.

Accordingly, it is desirable to provide, for example, a spectral purity filter for use in or with a radiation source, wherein secondary radiation may be removed completely or partially and/or contamination mitigation is effectively improved. In particular, it is desirable to provide a spectral purity filter comprising a body for use in or with a radiation source which is constructed to substantially reduce power load of electromagnetic radiation incident on the body.

According to an aspect of the invention, there is provided a spectral purity filter configured to transmit extreme ultraviolet (EUV) radiation and to deflect non-EUV secondary electromagnetic radiation, like deep-UV radiation and/or secondary radiation of the plasma source, for example the 10.6 μm radiation of the $CO_2$ laser, the spectral purity filter including a body of material transmissive of EUV radiation and a layer of material reflective to the non-EUV secondary radiation, the layer being located on a radiation incident side of the body. Optionally, a transmissivity for EUV radiation of the body of the material may be at least 20%. Additionally or alternatively, the body may include a multilayer structure which may comprise an anti-diffusion layer arranged to prevent material diffusion between layers. Such an anti-diffusion layer may include a silicide or a boron-carbide composition. The layer of material possibly has a reflectivity of at least 50% to the non-EUV secondary electromagnetic radiation.

A suitable material of the body may be selected from the group: rubidium (Rb), strontium (Sr), yttrium (Y), zirconium (Zr), niobium (Nb), molybdenum (Mo), carbon (C), ruthenium (Ru), and silicon (Si). However, especially zirconium (Zr) has been found to be a suitable material of the body.

The layer of material having reflection to the non-EUV secondary electromagnetic radiation is optionally selected from the group: molybdenum, ruthenium, gold, copper and carbon.

The layer of material optionally has at least 10% absorption, preferably at least 50% absorption, for electromagnetic radiation having a wavelength in a sub-micrometer range.

According to an aspect of the invention, there is provided a spectral purity filter configured to transmit extreme ultraviolet (EUV) radiation and to deflect non-EUV secondary electromagnetic radiation, the spectral purity filter including a body of material and a layer of high emissivity material, the layer being arranged on a radiation exit surface of the body. The body of material may be highly transmissive of EUV radiation. Additionally or alternatively, the body may include an anti-diffusion layer. Such an anti-diffusion layer may include a silicide or a boron-carbide composition.

According to an aspect of the invention, there is provided a source module for use in or with a lithographic apparatus, the source module being constructed to generate extreme ultraviolet (EUV) radiation and to output the EUV radiation and non-EUV secondary electromagnetic radiation, the source module comprising a spectral purity filter as described above.

According to an aspect of the invention, there is provided a lithographic apparatus arranged to project a pattern from a patterning device onto a substrate, comprising a spectral purity filter as described above and/or a source module as described above.

According to an aspect of the invention, there is provided a device manufacturing method comprising projecting a patterned beam of extreme ultraviolet (EUV) radiation onto a substrate, wherein the EUV radiation is filtered by a spectral purity filter as described above, generated by a source module as described above, or projected by a lithographic apparatus as described above.

According to an aspect of the invention, there is provided a device manufacturing method comprising: generating radiation comprising extreme ultraviolet (EUV) radiation and non-EUV secondary electromagnetic radiation using a radiation source; filtering the radiation to transmit EUV radiation and deflect non-EUV secondary electromagnetic radiation using a spectral purity filter comprising a body of material highly transmissive of EUV radiation and a layer of material highly reflective of non-EUV secondary radiation located on a radiation incident side of the body; and projecting a patterned beam of the transmitted EUV radiation onto a substrate.

According to an aspect of the invention, there is provided a device manufacturing method comprising: generating radiation comprising extreme ultraviolet (EUV) radiation and non-EUV secondary electromagnetic radiation using a radiation source; filtering the radiation to transmit EUV radiation and deflect non-EUV secondary electromagnetic radiation using a spectral purity filter comprising a body of material highly transmissive of EUV radiation and a layer of high emissivity material on a radiation exit surface of the body regarding the EUV radiation; and projecting a patterned beam of the transmitted EUV radiation onto a substrate.

Preferably, the spectral purity filter, as is set forth in the foregoing, is constructed to transmit at least 20% of the EUV radiation and to deflect at least 50% of the incident non-EUV secondary electromagnetic radiation. The layer of high emissivity material may have an emissivity of, for instance, at least 0.3.

A suitable material of the body may be selected from the group: rubidium (Rb), strontium (Sr), yttrium (Y), zirconium (Zr), niobium (Nb), molybdenum (Mo), carbon (C), ruthenium (Ru), and silicon (Si). However, especially zirconium (Zr) has been found to be a suitable material of the body.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
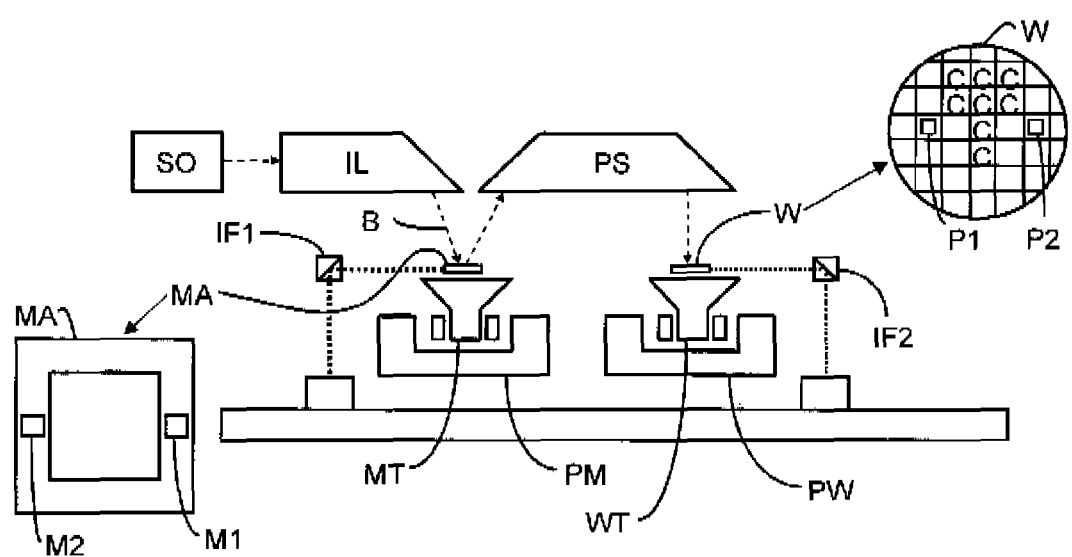
FIG. 1 schematically depicts a lithographic apparatus according to an embodiment of the invention.

FIG. 1 schematically depicts a lithographic apparatus 1 according to one embodiment of the invention. The apparatus comprises: an illumination system (illuminator) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is a $CO_2$ laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W.

With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
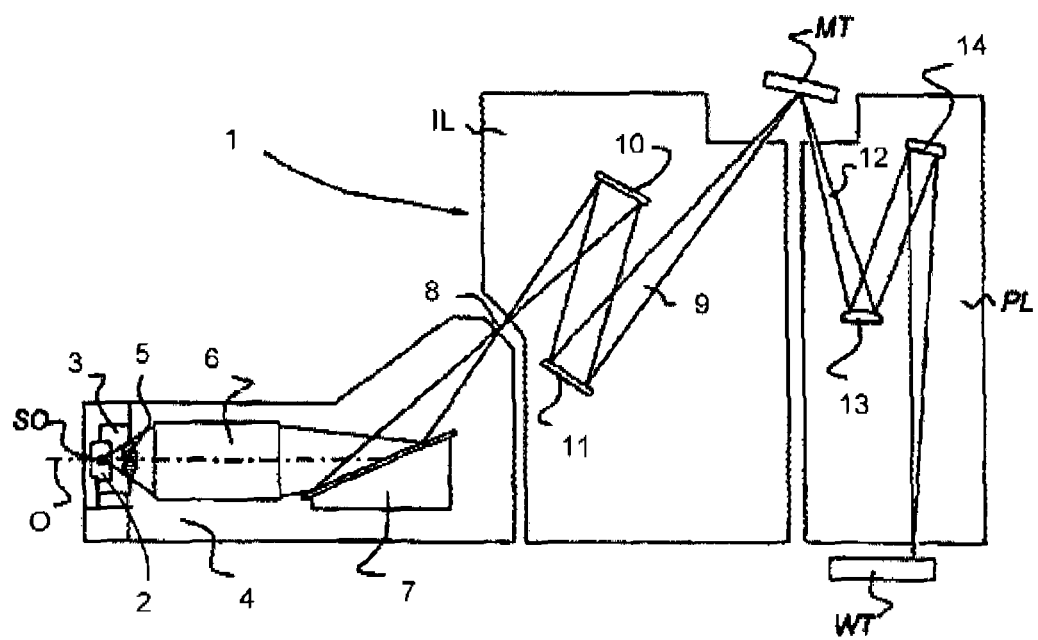
FIG. 2 depicts a detailed schematic illustration of a lithographic apparatus according to an embodiment of the invention.

FIG. 2 shows the apparatus 1 in more detail, including a radiation source SO, an illumination optics unit IL, and the projection system PL. The radiation source SO includes a radiation emitter 2 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4. In an embodiment, the radiation source SO includes the source chamber 3 and collector chamber 4.

The collector chamber 4 includes a contamination trap 5 and grazing incidence collector 6 (shown schematically as a rectangle). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a patterning device (e.g., a mask) positioned on support structure MT. A patterned beam 12 is formed which is imaged in projection system PL via first and second reflective elements 13, 14 onto a substrate (not shown) held on a substrate table WT. More elements than shown may generally be present in illumination optics unit IL and projection system PL.

Figure 3:
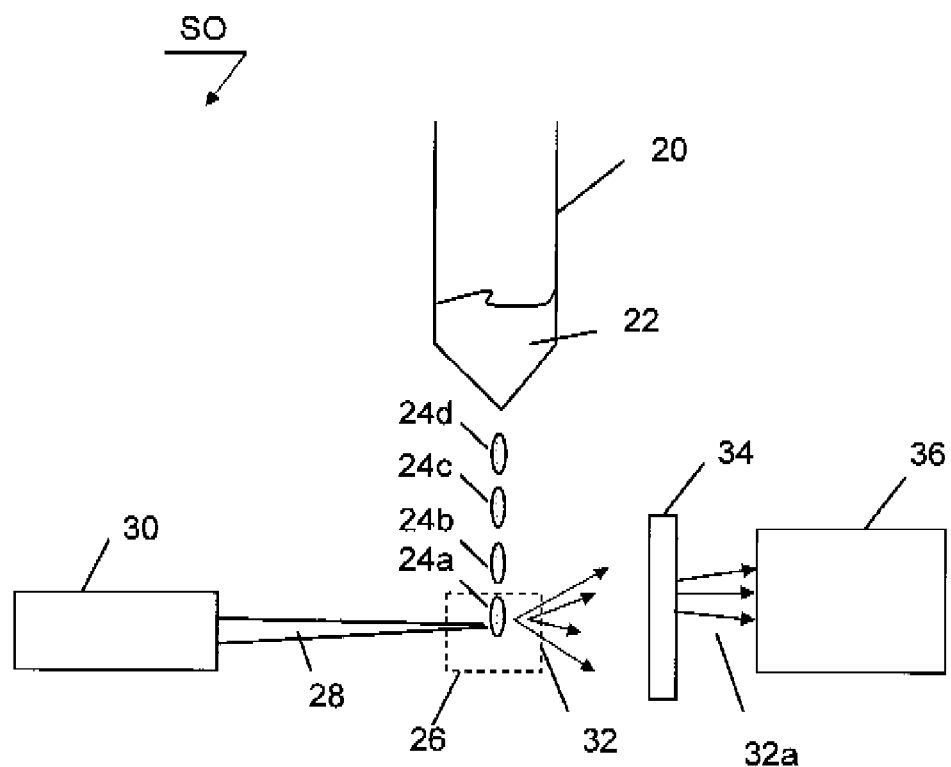
FIG. 3 schematically depicts a radiation source according to an embodiment of the invention.

FIG. 3 schematically depicts a radiation source according to an embodiment of the invention. The radiation source module SO may comprise a container 20 arranged with a liquefied target material 22, for example with Sn or Gd. The container 20 may be arranged with a suitable mechanism or opening (not shown) for delivery of liquid droplets 24a, 24b, 24c, 24d of Sn or Gd to the region 26 wherein a droplet is configured to be impinged by a laser beam 28 provided by a laser 30. The laser beam 28 may relate to a $CO_2$ laser having a wavelength of 10.6 micrometers. Alternatively, other suitable lasers may be used having respective wavelengths in the range of 1-11 micrometers. The laser beam is desirably focused in the region 26 using a suitable optical system (not shown). Upon interaction with the laser beam the droplets 24a, 24b, 24c, 24d are transferred into plasma state which may emit a 6.7 nm radiation, or any other EUV radiation in the range of 5-20 nanometers.

The emanating EUV beam 32 may be intercepted by a suitable debris mitigation system 34, such as contamination trap 5, schematically depicted in FIG. 2, configured to collect or to deflect particle debris emanating from the region 26. The EUV beam 32a substantially free of debris may then enter a subsequent optical system 36 of the radiation source or of the lithographic apparatus, such as illumination system IL of the lithographic apparatus configured to suitably condition the beam 32a. The radiation source SO may include a buffer gas for cooperating with a source of laser produced plasma. The buffer gas may have at least 50% transmissivity for the EUV radiation, and at least 70% absorption for the secondary radiation. Desirably, the buffer gas has at least 90% or at least 95% transmissivity for the EUV radiation. It is further desirable that the buffer gas has at least 90% absorption for the secondary radiation.

To improve spectral purity, a spectral purity filter for use in or with an EUV source may be used. A challenge is how to create a spectral purity filter with a high suppression of secondary electromagnetic radiation (e.g., by a factor 10 or higher) and a high transmittance for EUV radiation, since nearly all materials absorb EUV radiation. Additionally or alternatively, if the spectral purity filter is based on the principle of absorption of the secondary radiation, a challenge arises as to how to reduce the heat load on the spectral purity filter.

A purely reflective spectral purity filter may be used that combines an EUV radiation reflective top layer with an anti-reflective (AR) coating for infrared secondary radiation (e.g., 10.6 µm wavelength radiation). However it is challenging to find a material combination that simultaneously reflects EUV radiation efficiently and transmits or absorbs secondary radiation effectively at a sufficiently large range of angles.

A transmissive spectral purity filter may be used wherein the EUV radiation is transmitted and the secondary electromagnetic radiation (e.g., 10.6 µm wavelength radiation) is deflected. For example, a spectral purity filter may be provided that transmits both the EUV and secondary electromagnetic radiation, and changes the direction of the secondary electromagnetic radiation by diffraction through a phase grating. The secondary electromagnetic radiation can then be blocked by a body having an aperture therein, the EUV radiation passing through the aperture, to avoid thermal problems with the spectral purity filter. However, it may be difficult to obtain very high diffraction efficiency with such a phase grating as it involves very precise tuning of the geometry to the wavelength. It may also only be effective for a very narrow range of wavelengths and angles of incidence. In addition, such solution does not reduce power load of the radiation incident on a body of the spectral purity filter.

As another example, a structured metal film having a plurality of apertures may be used. The radiation transmissivity will be small if the apertures are significantly smaller than a wavelength of the electromagnetic radiation conceived to be at least partially intercepted. If they are much larger than a wavelength of the radiation, then the transmissivity will be proportional to the open area. Apertures of, for example, 1 to 5 µm cross-dimension (e.g., diameter) are small enough to substantially block 10.6 µm radiation, while being large enough to transmit EUV radiation. Instead of a two-dimensional structure with holes, a one-dimensional wire-grid may be used. Such a grid deflects only one of the polarizations of the electromagnetic radiation, but by using two of them in sequence in a crossed configuration both polarizations of the electromagnetic radiation can be deflected. However, in order to have sufficient EUV radiation transmissivity, the structure should be very open, and the walls between the apertures (or the wires of the wire-grid) should be very narrow. When the metal parts are too narrow, the 10.6 µm radiation will not be effectively suppressed anymore, and the structure may be very fragile and susceptible to heating problems.

A transmissive spectral purity filter is typically made of thin film as most materials are not transparent of EUV radiation. In an embodiment, the film comprises zirconium—one of the materials most transparent for EUV radiation. However, as the reflectivity to secondary electromagnetic radiation and the emissivity of such a film is low, a Zr spectral purity filter can suffer from overheating, which may limit its lifetime. For example, the optical properties of a Si/Zr thin film spectral purity filter can degrade when its heats up to a temperature above 400° C.

Therefore, a challenge remains for providing a spectral purity filter having high transmissivity properties for the EUV radiation with a wavelength in a range of 5-20 nm, preferably about 6.7 or 13.5 nm, and also being capable of efficient removal of the secondary electromagnetic radiation, for example having a wavelength of about 10.6 μm, from the EUV radiation beam.

According to an embodiment of the invention, there is provided a transmissive spectral purity filter with improved functionality. In particular, a spectral purity filter with improved or optimized cooling is provided. Performance of a transmissive thin film spectral purity filter may be improved by reducing its operation temperature and thus prolonging its lifetime. Such reduction may be achieved by providing a spectral purity filter having a structure comprising a body, wherein the structure is constructed for reflecting or deflecting of at least 50% of the secondary electromagnetic radiation from the EUV beam before said radiation reaches the body of the spectral purity filter. Details on the spectral purity filter according to an aspect of the invention will be discussed with reference to FIGS. 4 and 5.

Figure 4:
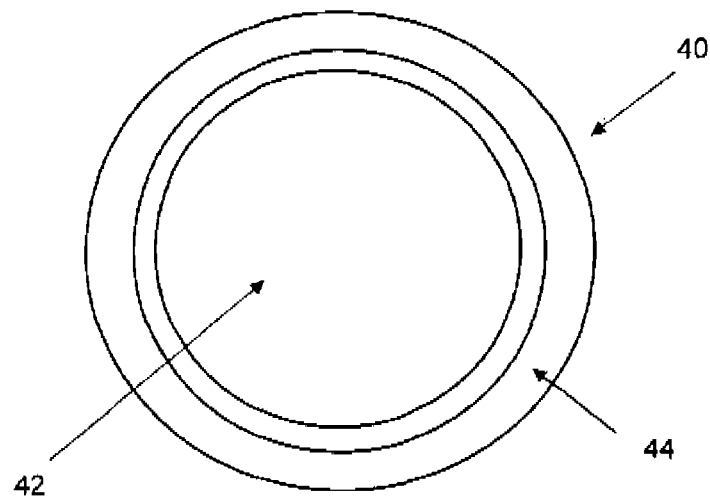
FIG. 4 schematically depicts a top view of a spectral purity filter according to an embodiment of the invention.

FIG. 4 schematically depicts a top view of a spectral purity filter 40 according to an embodiment of the present invention. Spectral purity filter 40 may be arranged with a multi-layered structure 42 comprising, for example, 50 alternating Zr/Si layers. An embodiment may have between 2-200 alternating Zr/Si layers.

In an embodiment, the spectral purity filter 40 may include a mesh (not shown). The mesh may be adjacent only one side of the multi-layered structure 42, or may be on both sides of the multi-layered structure 42, or may partially penetrate into the multi-layered structure 42, or may penetrate from one side to the other side of the multi-layered structure 42. The mesh enhances the integral strength of the multi-layered structure 42. The multi-layered structure 42 is mounted in a base 44. In an embodiment, the shape is substantially annular although it may be any shape. The base 44 facilitates incorporation of the spectral purity filter 40 into a lithographic apparatus.

Figure 5:
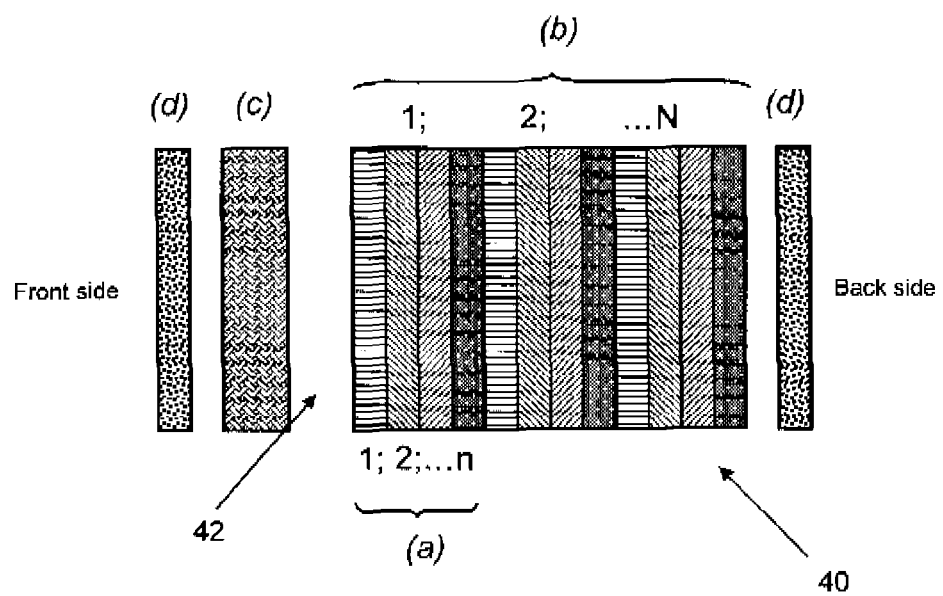
FIG. 5 schematically depicts a cross-section of a spectral purity filter according to an embodiment of the invention.

FIG. 5 schematically depicts a cross-section of part of the spectral purity filter 40 shown in FIG. 4. As seen in FIG. 5, the spectral purity filter 40 comprises a multi-layered structure 42. The multi-layered structure 42 has a front side and a back side as indicated. The front side receives the incident radiation and is optimized for maximum reflectivity of secondary electromagnetic radiation. It will be appreciated that for enabling a substantial reduction of the power load of radiation incident on the multi-layered structure 42, deflection of at least 50% of the secondary electromagnetic radiation is sufficient. Some of the layers (elements (c) and (d)) are shown spaced apart from other layers for clarity but in practice all the layers are in contact or very closely adjacent to each other.

Element (b) of the multi-layered structure 42 corresponds to the body of the spectral purity filter. The body comprises a single or a multilayer of material transparent for EUV radiation. The multilayer may include a single layer (element (a)) repeated up to N times in the body or a multilayer stack (element (a)) repeated up to N times in the body. The multilayer stack (element (a)) can include up to n layers. A plurality of single layers need not comprise the same layers of materials. The multilayer stack need not comprise the same layers of materials or in the same order. The materials and order of the layers may be rearranged in order to provide maximum EUV radiation transparency, and/or maximum reflection of secondary electromagnetic radiation, and/or minimum operation temperature.

Element (c) of the multi-layered structure 42 is a layer of material highly reflective to secondary electromagnetic radiation (e.g., 10.6 μm wavelength radiation). This layer reduces the power load on the filter body by reflecting or deflecting the secondary electromagnetic radiation and thereby reduces the operation temperature of the body of the spectral purity filter. Suitable materials include molybdenum, ruthenium, gold, copper and carbon. Especially molybdenum has suitable conduction properties, while maintaining a good EUV radiation transmissivity. It will be appreciated that although the functioning of the spectral purity filter is discussed with reference to the 10.6 μm radiation, such an example is not limitative.

Element (d) of the multi-layered structure 42 may be a layer of material with high emissivity. It will be appreciated that the element (d) is optional at a front surface of the spectral purity filter, but is desirably always arranged at a back surface of the body (b) that is at a radiation exit surface of the body (b). This layer helps increase cooling of the spectral purity filter, due to the fact that the power (P) is related to the temperature (T) by emissivity ($\epsilon$), when radiation is emitted from one surface, given by the formula: $P = \text{const} * \epsilon T^4$. In an embodiment, the material of this layer is a carbide, oxide and/or nitrite. Carbides and oxides have very high emissivity $\epsilon > 0.9$. It will be appreciated that emissivity of at least 0.3 may be sufficient for practical applications. The layer can be implemented on the back and/or front side of the spectral purity filter. The layer may be made of a different material than used in the body of the spectral purity filter. The layer may be realized by the surface treatment of body material (a) and/or (b), or of the reflective layer material (c).

When the layer (d) is arranged at a front (i.e. radiation incident) surface of the body (b) of the spectral purity filter, it is desirably constructed to enable at least 10%, more desirably at least 50% absorption of secondary radiation having wavelengths in a sub-micrometer range. Desirably, the body (b) of the spectral purity filter, is constructed to enable at least 90% absorption of the secondary radiation entered into the body. As a result, for example, deep UV radiation present in the EUV beam is substantially filtered out, thereby further decreasing power load of the electromagnetic radiation on the body (b) of the spectral purity filter.

Examples of materials that can be used in the spectral purity filter according to an embodiment of the invention include: rubidium (Rb), strontium (Sr), yttrium (Y), zirconium (Zr), niobium (Nb), molybdenum (Mo), carbon (C), ruthenium (Ru), silicon (Si) as well as their oxides, carbides and nitrites. See FIGS. 6 and 7 for comparison of properties of these materials. Silicon is typically used to suppress DUV radiation.

Figure 6:
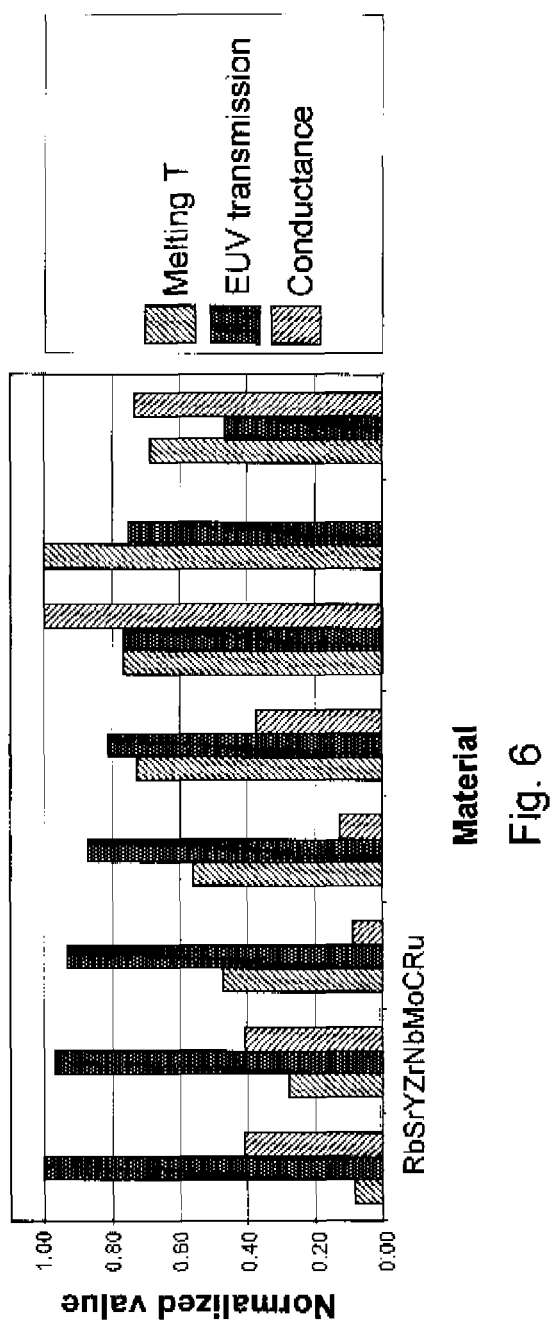
FIG. 6 depicts a graphical comparison of materials with high EUV radiation transmissivity.

FIG. 6 depicts a graphical comparison of materials (rubidium (Rb), strontium (Sr), yttrium (Y), zirconium (Zr), niobium (Nb), molybdenum (Mo), carbon (C), and ruthenium (Ru)) with high EUV radiation transmissivity. Melting temperature, EUV transmissivity and conductance are represented in relative scale normalized to the maximum. Maximum values are: Melting temperature=3800 K; EUV transmissivity=0.967; Conductance=$0.187 \cdot 10^6$ Ohm$^{-1}$ cm$^{-1}$. EUV transmissivity for all materials is given for the thickness of 50 nm.

Figure 7:
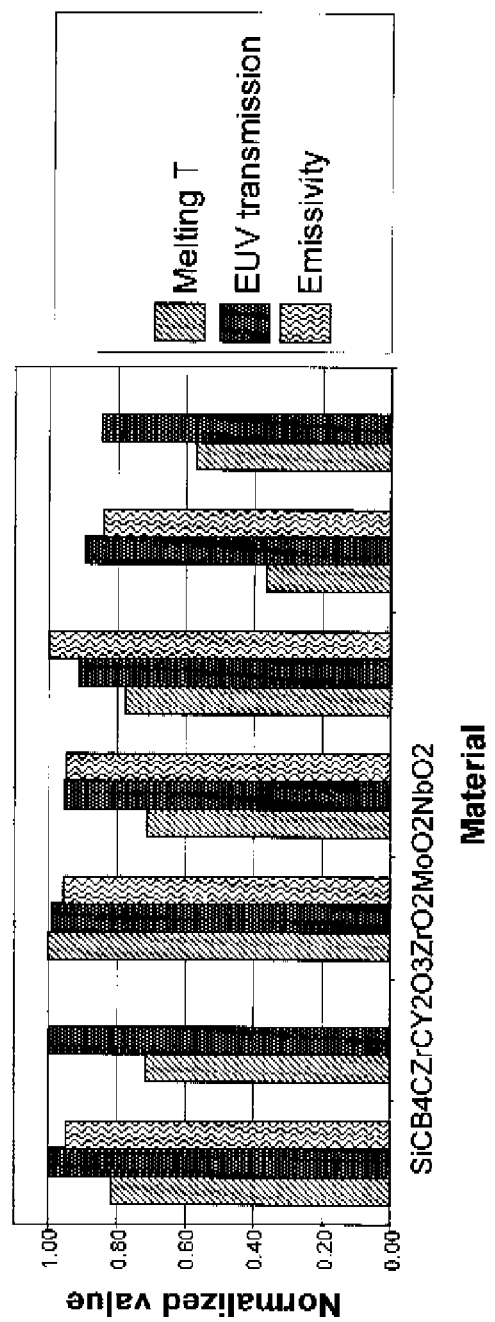
FIG. 7 depicts a graphical comparison of materials with high emissivity.

FIG. 7 depicts a graphical comparison of materials (silicon carbide (SiC), boron carbide ($B_4C$), zirconium carbide (ZrC), yttrium oxide ($Y_2O_3$), zirconium oxide ($ZrO_2$), molybdenum dioxide ($MoO_2$) and niobium dioxide ($NbO_2$)) with high emissivity. Melting temperature, EUV transmissivity and emissivity are represented in relative scale normalized to the maximum. Maximum values are: Melting temperature=3803 K; EUV transmissivity=0.956; Emissivity=0.95. EUV transmissivity for all materials is given for the thickness of 10 nm.

In an embodiment, the body (element (b)) may have Zr layers, each of about 1 nm thickness, and Si layers, each of about 3 nm thickness. In an embodiment, the thicknesses of each of the layers may be variable, i.e., not all layers have the same thickness, whether of different materials or of the same material.

When a spectral purity filter having Si and Zr layers heats up to a high temperature, a Si layer may diffuse through the Zr layer and form a silicide transparent for DUV radiation. To help prevent diffusion of Si and silicidation of Zr, the body (element (a) and/or element (b)) of the spectral purity filter shown in FIG. 5 is made of the following layer structure [Zr/ZrSi$_2$/Si/ZrSi$_2$/Zr]. The layer of zirconium silicide (ZrSi$_2$) acts as a diffusion barrier. Alternatively or additionally the diffusion barrier layer may comprise a boron-carbide composition. Typical thicknesses of the layers of each material is selected from the range of 0.2-10 nm. A ZrSi$_2$ layer can be applied, for example, by magnetron sputtering. Yttrium or any other suitable material from FIG. 6 can be used in place of Zr. Accordingly, a suitable silicide of yttrium or other suitable material may be used as the diffusion barrier.

Accordingly, a spectral purity filter with high EUV radiation transmissivity, long lifetime and low operation temperature may be provided. In an embodiment, the spectral purity filter is optimized for maximum reflection of $CO_2$ laser radiation and maximum emissivity. In an embodiment, performance of a Si/Zr thin film spectral purity filter is improved by reducing its operation temperature, thus prolonging the lifetime of such a spectral purity filter. In an embodiment, the power load of $CO_2$ laser radiation on the spectral purity filter can be reduced at least by a factor of 5. Operation temperature of the spectral purity filter can be reduced by more than 200 degrees C.

In an embodiment, the power delivered to a substrate and/or a part of the lithography apparatus due to secondary electromagnetic radiation, and contrast loss due to the presence of secondary electromagnetic radiation, can be significantly reduced. Thermal stability of the EUV radiation beam focus may be improved and overlay uncertainty decreased.

It will be appreciated that embodiments of the invention may be used for any type of EUV source, including but not limited to a discharge produced plasma source (DPP source), or a laser produced plasma source (LPP source). However, an embodiment of the invention may be particularly suited to suppress radiation from a laser source, which typically forms part of a laser produced plasma source. This is because such a plasma source often outputs secondary electromagnetic radiation arising from the laser.

The spectral purity filter may be located practically anywhere in the radiation path. In an embodiment, the spectral purity filter is located in a region that receives EUV-containing radiation from the EUV radiation source and delivers the EUV radiation to a suitable downstream EUV radiation optical system, wherein the radiation from the EUV radiation source is arranged to pass through the spectral purity filter prior to entering the optical system. In an embodiment, the spectral purity filter is in the EUV radiation source. In an embodiment, the spectral purity filter is in the EUV lithographic apparatus. In an embodiment, the spectral purity filter is located in a radiation path after the plasma but before the collector. In an embodiment, the concepts herein may incorporated into windows or gas locks of lithographic apparatus or other tool.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A spectral purity filter configured to transmit extreme ultraviolet (EUV) radiation and to deflect non-EUV secondary electromagnetic radiation, the spectral purity filter comprising a body of material having a transmissivity for EUV radiation in the range of 5-20 nm of at least 20% and a layer of material having reflection to the non-EUV secondary electromagnetic radiation of at least 50%, said layer being located on a radiation incident side of the body.

2. The spectral purity filter according to claim 1, further comprising a layer of high emissivity material at a radiation exit surface of the body.

3. The spectral purity filter according to claim 2, wherein the emissivity of the material is greater than 0.3.

4. The spectral purity filter according to claim 2, wherein the layer of high emissivity material is located on a radiation incident side of the said layer of material.

5. The spectral purity filter according to claim 1, wherein the layer of material having reflection to the non-EUV secondary electromagnetic radiation is selected from the group: molybdenum, ruthenium, gold, copper and carbon.

6. The spectral purity filter according to claim 1, wherein the layer of material has at least 10% absorption for electromagnetic radiation having a wavelength in a sub-micrometer range.

7. A spectral purity filter configured to transmit at least 20% of extreme ultraviolet (EUV) radiation in the range of 5-20 nm and to deflect at least 50% of non-EUV secondary electromagnetic radiation, the spectral purity filter comprising a body of material and a layer of high emissivity material having emissivity of at least 0.3, said layer of high emissivity material being arranged on a radiation exit surface of the body.

8. The spectral purity filter according to claim 7, wherein the layer of high emissivity material is located on a radiation incident side of the body.

9. The spectral purity filter according to claim 7, wherein the body comprises a multilayer structure of material transmissive of EUV radiation and material suppressive of non-EUV secondary electromagnetic radiation.

10. The spectral purity filter according to claim 7, wherein a material of the body is selected from the group: rubidium (Rb), strontium (Sr), yttrium (Y), zirconium (Zr), niobium (Nb), molybdenum (Mo), carbon (C), ruthenium (Ru), and silicon (Si).

11. A source module constructed to generate extreme ultraviolet (EUV) radiation and to output the EUV radiation and non-EUV secondary electromagnetic radiation, the source module comprising a spectral purity filter configured to transmit extreme ultraviolet (EUV) radiation and to deflect non-EUV secondary electromagnetic radiation, the spectral purity filter comprising a body of material having a transmissivity for EUV radiation in the range of 5-20 nm of at least 20% and a layer of material having reflection to the non-EUV secondary electromagnetic radiation of at least 50%, said layer being located on a radiation incident side of the body.

12. A lithographic apparatus arranged to project a pattern from a patterning device onto a substrate, the lithographic apparatus comprising a spectral purity filter configured to transmit extreme ultraviolet (EUV) radiation and to deflect non-EUV secondary electromagnetic radiation, the spectral purity filter comprising a body of material having a transmissivity for EUV radiation in the range of 5-20 nm of at least 20% and a layer of material having reflection to the non-EUV secondary electromagnetic radiation of at least 50%, said layer being located on a radiation incident side of the body.

13. A device manufacturing method comprising:
generating radiation comprising extreme ultraviolet (EUV) radiation and non-EUV secondary electromagnetic radiation using a radiation source;
filtering the radiation to transmit EUV radiation and deflect non-EUV secondary electromagnetic radiation using a spectral purity filter comprising a body of material having at least 50% transmissivity to EUV radiation in the range of 5-20 nm and a layer of material having at least 50% reflection of non-EUV secondary electromagnetic radiation located on a radiation incident side of the body; and
projecting a patterned beam of the transmitted EUV radiation onto a substrate.

14. A device manufacturing method comprising:
generating radiation comprising extreme ultraviolet (EUV) radiation and non-EUV secondary electromagnetic radiation using a radiation source;
filtering the radiation to transmit EUV radiation and deflect non-EUV secondary electromagnetic radiation using a spectral purity filter comprising a body of material having at least 20% transmissivity to EUV radiation in the range of 5-20 nm and a layer material having emissivity of at least 0.3 at a radiation exit surface of the body; and
projecting a patterned beam of the transmitted EUV radiation onto a substrate.

15. The spectral purity filter according to claim 6, wherein the layer of material has at least 50% absorption for electromagnetic radiation having a wavelength in a sub-micrometer range.

16. The spectral purity filter according to claim 1, wherein the body of material is constructed to absorb at least 90% of the non-EUV secondary electromagnetic radiation that enters the body.

17. The spectral purity filter according to claim 1, wherein the body of material comprises layers of Zr and Si.

18. The spectral purity filter according to claim 17, wherein the body of material comprises a layer structure of $Zr/ZrSi_2/Si/ZrSi_2/Zr$.

19. The spectral purity filter according to claim 18, wherein a thickness of each layer of the layer structure is in the range of 0.2 nm- 10 nm.

* * * * *